United States Patent
Olgaard et al.

[19]

[11] Patent Number: 5,939,949
[45] Date of Patent: Aug. 17, 1999

[54] SELF-ADJUSTING STARTUP CONTROL FOR CHARGE PUMP CURRENT SOURCE IN PHASE LOCKED LOOP

[75] Inventors: Christian Olgaard; Subramanian Parameswaran, both of Santa Clara, Calif.

[73] Assignee: National Semiconductor Corporation, Santa Clara, Calif.

[21] Appl. No.: 09/042,589

[22] Filed: Mar. 16, 1998

[51] Int. Cl.[6] .................................................. H03L 7/093
[52] U.S. Cl. ................................ 331/17; 331/1 A; 331/25
[58] Field of Search ................................ 331/1 A, 17, 25

[56] References Cited

U.S. PATENT DOCUMENTS

5,764,108  6/1998  Rose et al. ................................. 331/17
5,783,972  7/1998  Nishikawa ................................. 331/17
5,847,614  12/1998 Gilbert et al. ............................. 331/14

*Primary Examiner*—Siegfried H. Grimm
*Attorney, Agent, or Firm*—Skjerven, Morrill, MacPherson, Franklin & Friel, LLP

[57] ABSTRACT

A circuit and a method are provided for reducing power consumption in a phase-locked loop (PLL) by controlling how long the bias current for the charge pump is turned on. In such a circuit, a bias check circuit that indicates when the bias current has stabilized, and a self-adjusting control circuit including an internal counter are provided to measure how long the bias current takes to start up when the PLL is locked. Then the self-adjusting control circuit prevents the bias current from turning on until there is just enough time for it to stabilize before a charge pump event. A default control circuit is also provided to turn the bias current on for specified intervals when the PLL is out of lock.

11 Claims, 6 Drawing Sheets

SELF-ADJUSTING STARTUP CONTROL FOR CHARGE PUMP CURRENT SOURCE IN PHASE LOCKED LOOP

BACKGROUND OF THE INVENTION

1. Field of the Invention

The present invention relates to integrated circuit phase-locked loops, and in particular, to a bias current control circuit for minimization of power consumption.

2. Discussion of the Related Art

Figure 1:
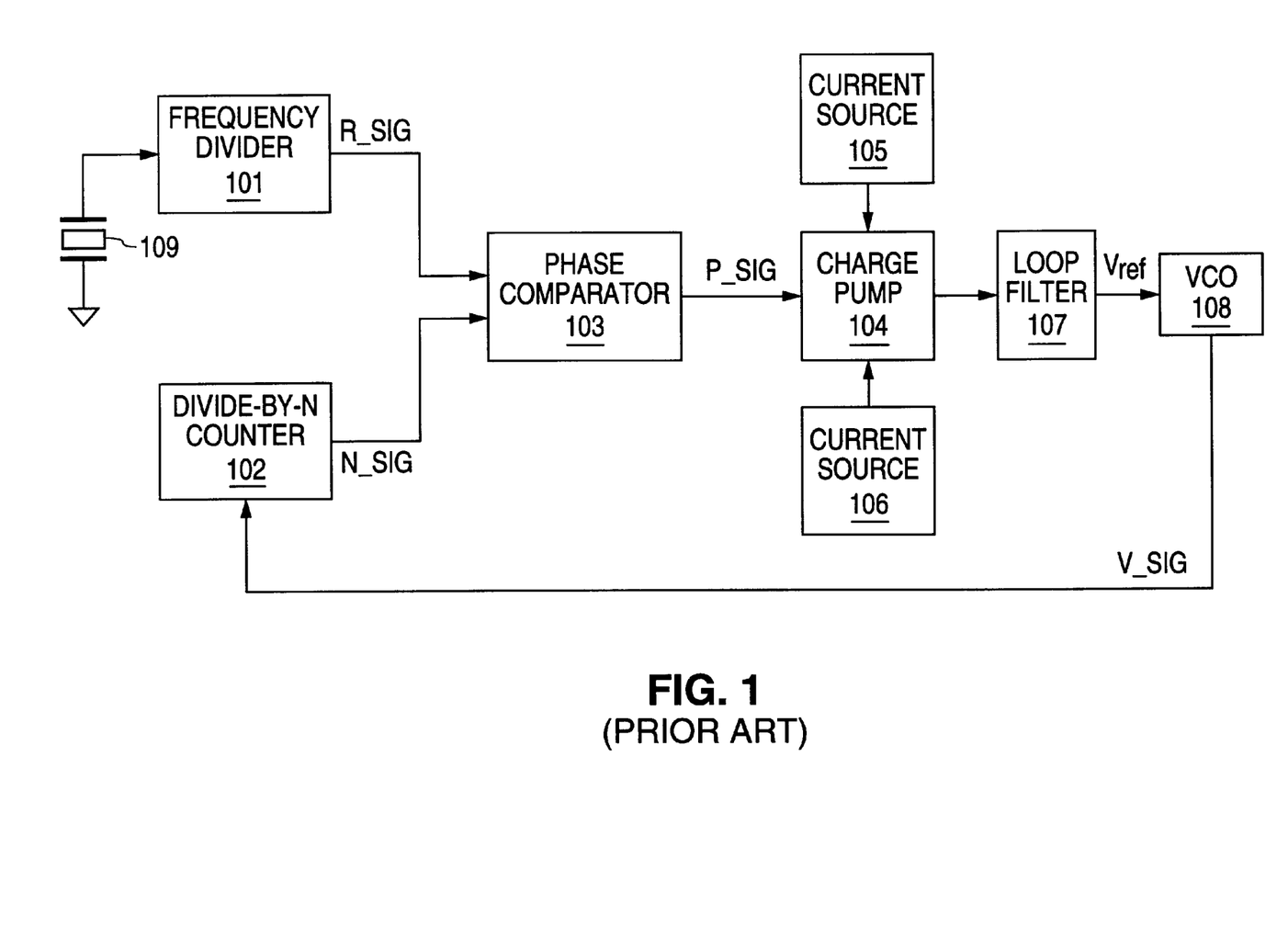
FIG. 1 shows, in the prior art, a conventional PLL.

In an integrated circuit, a phase-locked loop, or PLL, is used to track the frequency of an incoming signal and also free the incoming signal from noise. A conventional PLL implementation is shown in FIG. 1. A reference input signal R_SIG is provided by a stable oscillator such as a crystal oscillator 109 and a frequency divider 101. Signal R_SIG is made up of clock pulses of frequency $f_{ref}$, which is defined by:

$$f_{ref} = f_c/R$$

where $f_c$ is the crystal frequency and R is the division factor of frequency divider 101. Concurrently, voltage-controlled oscillator a VCO 108 sends a frequency divider 102 a signal V_SIG made up of clock pulses of frequency $f_{vco}$. Frequency divider 102, having a division factor of N, generates a signal N_SIG having a frequency $f_N$, which is defined by:

$$f_N = f_{vco}/N$$

A phase comparator 103 compares the relative timing of signal R_SIG and signal N_SIG, and outputs an error signal P_SIG based on their phase and frequency difference. Signal P_SIG causes a charge pump 104 to generate pulses that both sink and source current. Current sources 105 and 106 provide charge pump 104 with bias currents required for proper pulse generation. These pulses charge or discharge a loop filter 107, which consequently produces an output voltage Vref. Voltage Vref is applied to VCO 108, which adjusts VCO 108's frequency accordingly. In this manner, $f_N$ is adjusted to match $f_{ref}$.

Figure 4:
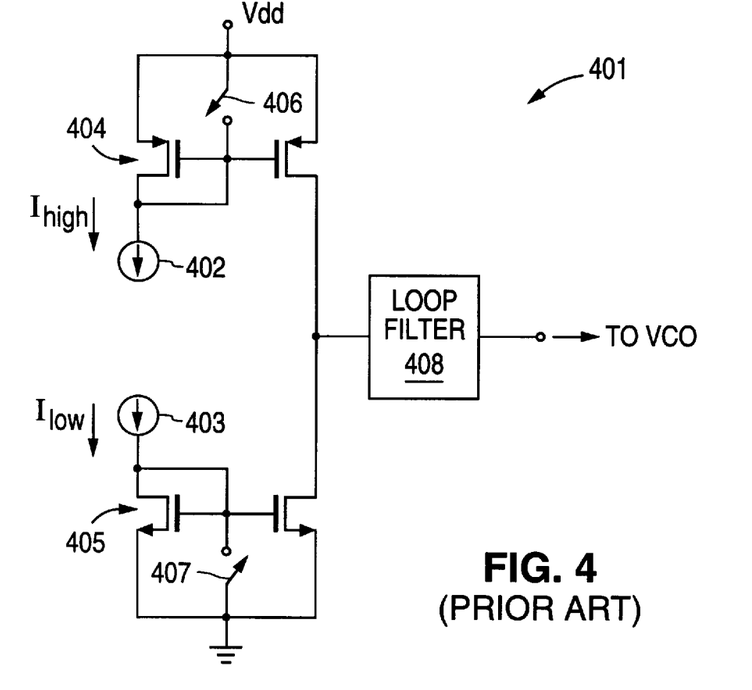
FIG. 4 shows, in the prior art, a schematic model of a conventional charge pump and loop filter circuit in a PLL.

Charge pump 104, current sources 105 and 106, and loop filter 107 can be modeled by the schematic circuit 401 of FIG. 4. As shown in FIG. 4, a current source 402 is coupled to a current mirror 404. When a switch 406 is closed, current flows directly from Vdd to current source 402, without passing through current mirror 404. When switch 406 is opened, a bias current High flows through current mirror 404, charging a loop filter 408. Similarly, a current source 403 is coupled to a current mirror 405. When a switch 407 is closed, current flows directly from current source 403 to ground. When switch 407 is opened, a bias current Ilow flows through current mirror 405, discharging loop filter 408. The voltage on loop filter 408 determines the output frequency of VCO 108. Therefore, the output of phase comparator 103, which controls the activity of switches 406 and 407, actually tunes the frequency of VCO 108.

The use of a current source in combination with a current mirror provides an accurate, rapid-switching output that can be applied to multiple locations. However, the bias currents required for such a configuration can unnecessarily dissipate power in the circuit. As can be seen in FIG. 4, current mirrors 404 and 405 only require a bias current when switches 406 and 407, respectively, are open. In general, switches 406 and 407 are only open for a small percentage of the time, especially when the PLL is phase-locked. At all other times, switches 406 and 407 are closed, meaning that the bias currents from current sources 402 and 403 are simply dissipating energy. An effort to reduce this excess power consumption is demonstrated in co-pending Patent Application NS3341 by Olgaard. The co-pending Patent Application of Olgaard describes a scheme in which a fixed control circuit is implemented to turn on the bias currents only during pre-specified intervals. By turning off bias currents during a portion of the time that bias currents are not needed, total power consumption is reduced. However, the bias current activation intervals must be defined according to the max imum possible charge pump operating frequency, while the charge pump is generally running at much less than maximum frequency. Consequently, the bias currents are still unnecessarily flowing for significant periods of time.

Ac cordingly, it is desirable to provide a bias control circuit that is capable of minimizing bias circuit power consumption by turning on bias currents only when required by charge pump activity.

SUMMARY OF THE INVENTION

The present invention provides, in an integrated circuit that includes a frequency divider and a charge pump as part of a phase-locked loop (PLL), a circuit for turning on a charge pump bias current only when required by the charge pump. According to the present invention, the circuit for controlling the bias current includes: (i) a bias checking circuit for indicating when the bias current has stabilized; (ii) a default control circuit to turn on the bias current at prespecified intervals when the PLL is out of lock; and (iii) a self-adjusting control circuit that operates when the PLL is locked, to measure how long the bias current takes to stabilize after being turned on, and then turn on the bias current that amount of time before actual charge pump operation occurs.

In an embodiment of the present invention, the bias checking circuit includes a checking resistor to produce a bias checking voltage, and a reference current source and a tracking resistor to produce a reference voltage. A comparator is used to generate a signal indicating bias current stabilization when the bias voltage reaches the reference voltage. The circuit further includes hysteresis to eliminate potential multiple triggering.

In another embodiment of the present invention, the self-adjusting control circuit further includes: (i) a stabilization counter for measuring the length of time required for the bias current to stabilize; (ii) an adder to add a predefined amount to the count measured by the stabilization counter in order to provide tolerance for slight variations during actual operation; and (iii) a comparator to generate a signal to turn on the bias current when the count in the frequency divider in the PLL reaches the count produced by the adder.

The present invention provides a circuit that minimizes PLL power consumption. When the PLL is locked, the self-adjusting control circuit turns on the bias current only when required by the charge pump. When the PLL is running out of lock, the input frequencies can be changing every charge pump cycle, making the self-adjusting control circuit unfeasible. Accordingly, at that point, bias current activation control is transferred to the default control circuit. While the PLL is out of lock, the default control circuit reduces wasted power by turning on the bias current only when it would be required were the charge pump operating at maximum frequency. When the PLL locks on the input signal again, the self-adjusting control circuit minimizes power dissipation by re-adjusting the bias current activation intervals based on the application-specific charge pump operating frequency.

The present invention will be better understood upon consideration of the accompanying drawings and the detailed description below.

BRIEF DESCRIPTION OF THE DRAWINGS

Use of the same reference numbers in different figures indicates similar or like elements.

DETAILED DESCRIPTION

Figure 2:
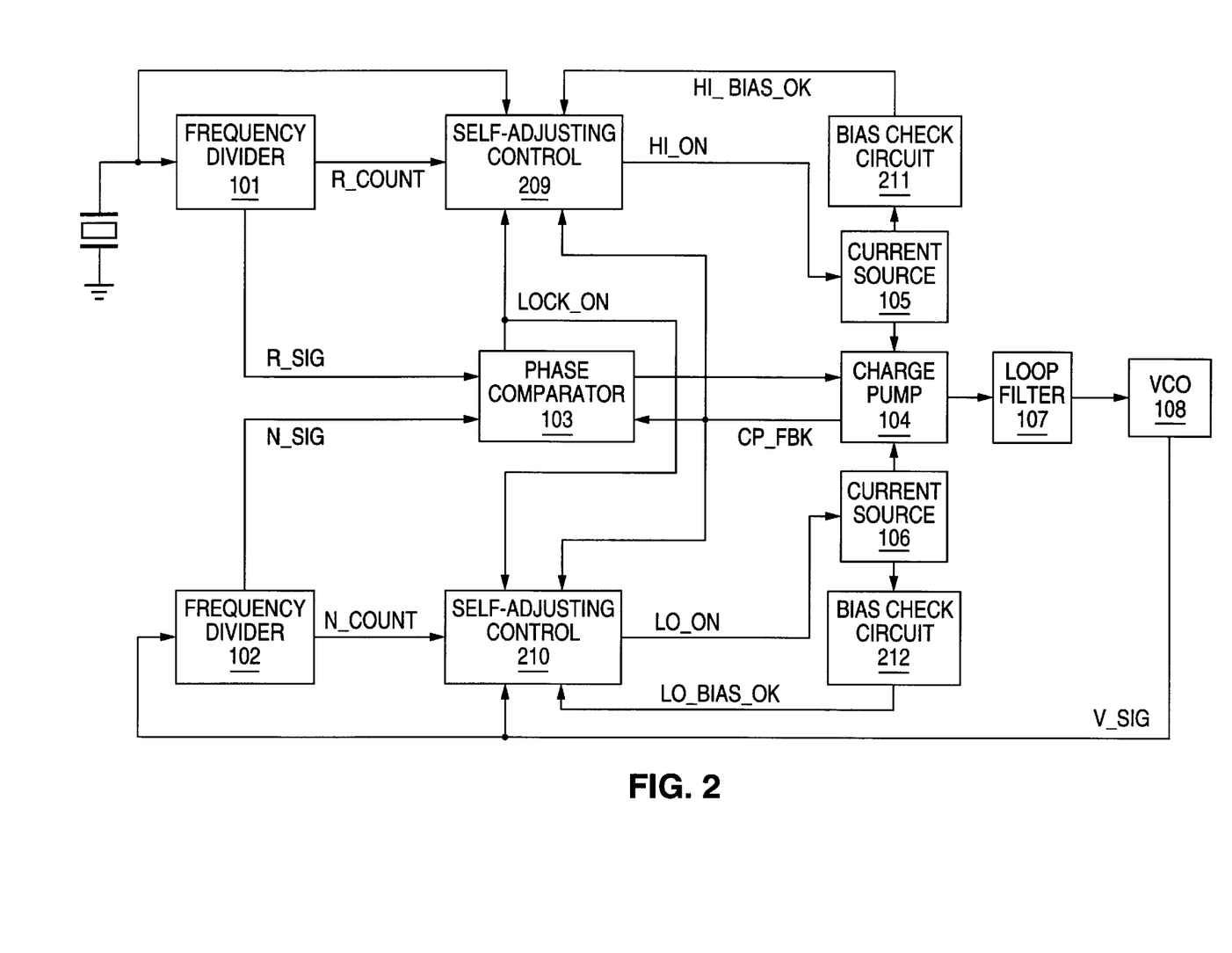
FIG. 2 shows a PLL incorporating self-adjusting bias control.

The present invention reduces power consumption in a charge pump circuit of a PLL by turning on the bias currents only when required by the charge pump. FIG. 2 shows a block diagram of the present invention incorporated into a PLL. Self-adjusting controls 209 and 210, and bias check circuits 211 and 212 are integrated with the components of a conventional PLL. Self-adjusting control 209 turns a bias current on by supplying a signal HI_ON to a current source 105 at regular intervals. When the PLL is out of lock, the regular intervals are preset, based on the maximum operating frequency of a charge pump 104 and the length of time required for the output current of current source 105 to stabilize. When the PLL is locked, a phase comparator 103 sends a signal LOCK_ON to self-adjusting control 209. Self-adjusting control 209 then measures the interval between its assertion of signal HI_ON and the generation of a signal HI_BIAS_OK by bias check circuit 211. This interval represents the time required for the bias current from current source 105 to stabilize after being turned on. The interval is used to generate a signal that turns on current source 105 just long enough before charge pump operation for the bias current to reach steady-state. This optimized control continues until the PLL goes back out of lock, whereupon self-adjusting control 209 resumes the preset regular interval activation of current source 105. In the same manner, self-adjusting control 210 minimizes the time of bias current generation by a current source 106. Self-adjusting control 210 turns a bias current on by supplying a signal LO_ON to current source 106 at regular intervals. When the PLL is out of lock, these regular intervals are preset, based on the maximum operating frequency of charge pump 104 and the length of time required for the output of current source 106 to stabilize. Once the PLL is locked, phase comparator 103 sends a signal LOCK_ON to self-adjusting control 210. Self-adjusting control 210 then measures the interval between its assertion of signal LO_ON and the generation of a signal LO_BIAS_OK by bias check circuit 212. This interval represents the time required for the bias current from current source 106 to stabilize after being turned on. The interval is used to generate a signal that turns on current source 106 just long enough before charge pump operation for the bias current to reach steady-state. This optimized control continues until the PLL goes back out of lock, whereupon self-adjusting control 210 resumes the preset regular interval activation of current source 106. At the completion of each charge pump event, the falling edge of a signal CP_FBK from charge pump 104 instructs circuits 209 and 210 to turn off bias currents.

Figure 3:
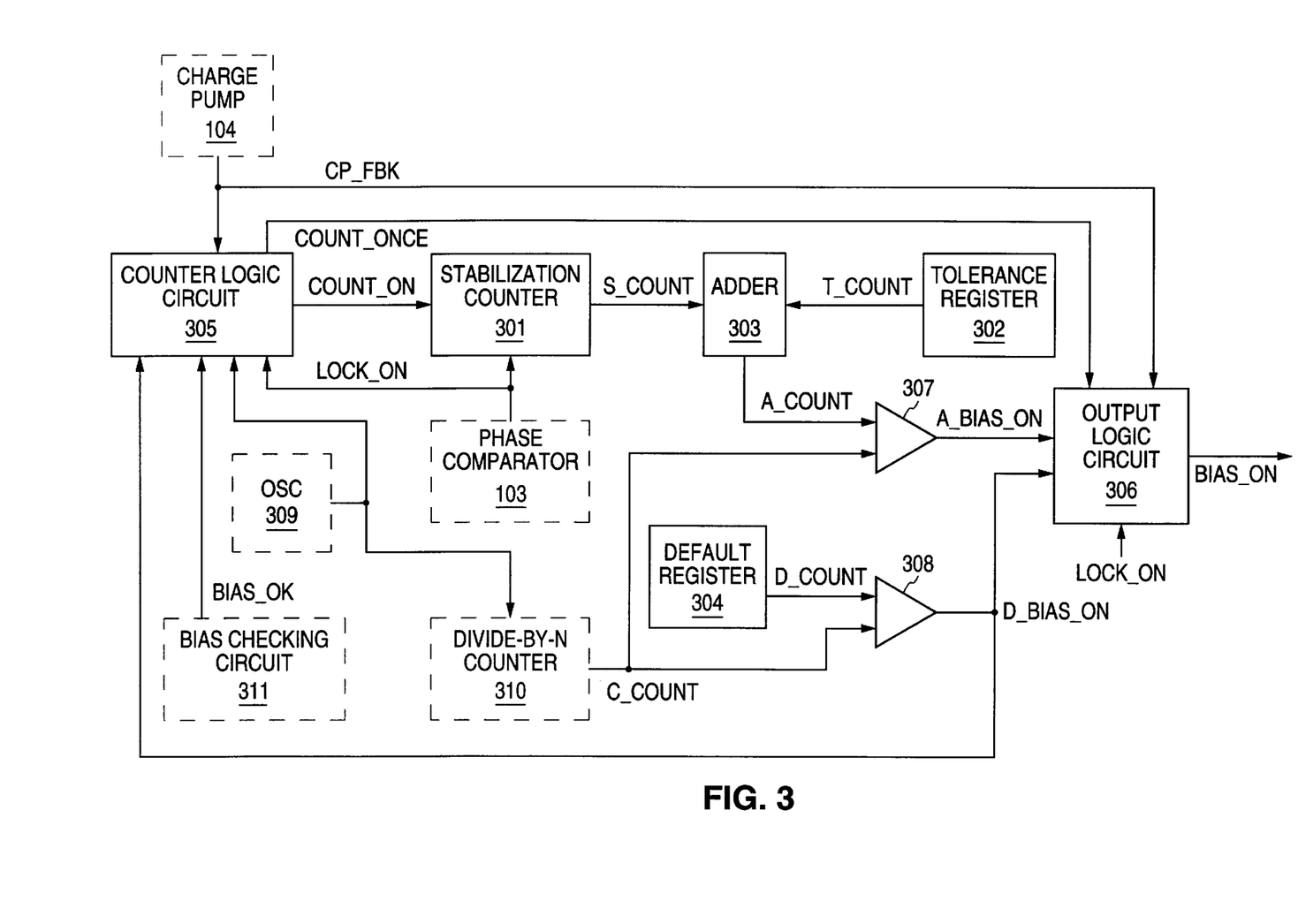
FIG. 3 shows an embodiment of the present invention.

Both self-adjusting control 209 and self-adjusting control 210 can utilize the same basic circuit, an embodiment of which is depicted in FIG. 3. A reference oscillator 309 generates clock pulses at the input terminal of a divide-by-N countdown counter 310. A count C_COUNT of the number of counts within counter 310 is compared with the output of a default register 304. Default register 304 contains a prespecified count D_COUNT determined to be the point at which bias current would need to be turned on if charge pump 104 were operating at its maximum possible frequency. When count C_COUNT reaches count D_COUNT, a comparator 308 asserts a signal D_BIAS_ON. While the PLL is out of lock, an output logic circuit 306 provides signal D_BIAS_ON as a signal BIAS_ON, which turns on a bias current source (not shown). When the PLL goes into a locked state, phase comparator 103 generates signal LOCK_ON, which resets a counter logic circuit 305 and a stabilization counter 301. The next time signal D_BIAS_ON is asserted, circuit 305 generates a clock pulse signal COUNT_ON that clocks stabilization counter 301. When circuit 305 receives a signal BIAS_OK from a bias checking circuit 311, stabilization counter 301 latches its count value as an output S_COUNT. Until it is reset by the next signal LOCK_ON, circuit 305 prevents any further counting by counter 301. A count T_COUNT from a tolerance register 302 is added to output S_COUNT by an adder 303, which provides the result as a count A_COUNT. Count T_COUNT is a predefined constant value that represents a tolerance band to guard against normal variations in bias circuit operation and ensure sufficient time for bias current stabilization prior to charge pump operation. Count A_COUNT determines the number of clock pulses to be reached by counter 310 before turning on the bias current source. When count C_COUNT reaches count A_COUNT, a comparator 307 sends a signal A_BIAS_ON to output logic circuit 306. A signal CNT_ONCE from circuit 305 indicates that output A_COUNT has been defined, and causes output logic circuit 306 to pass signal A BIAS_ON as signal BIAS_ON to turn on the bias current source.

Figure 7A:
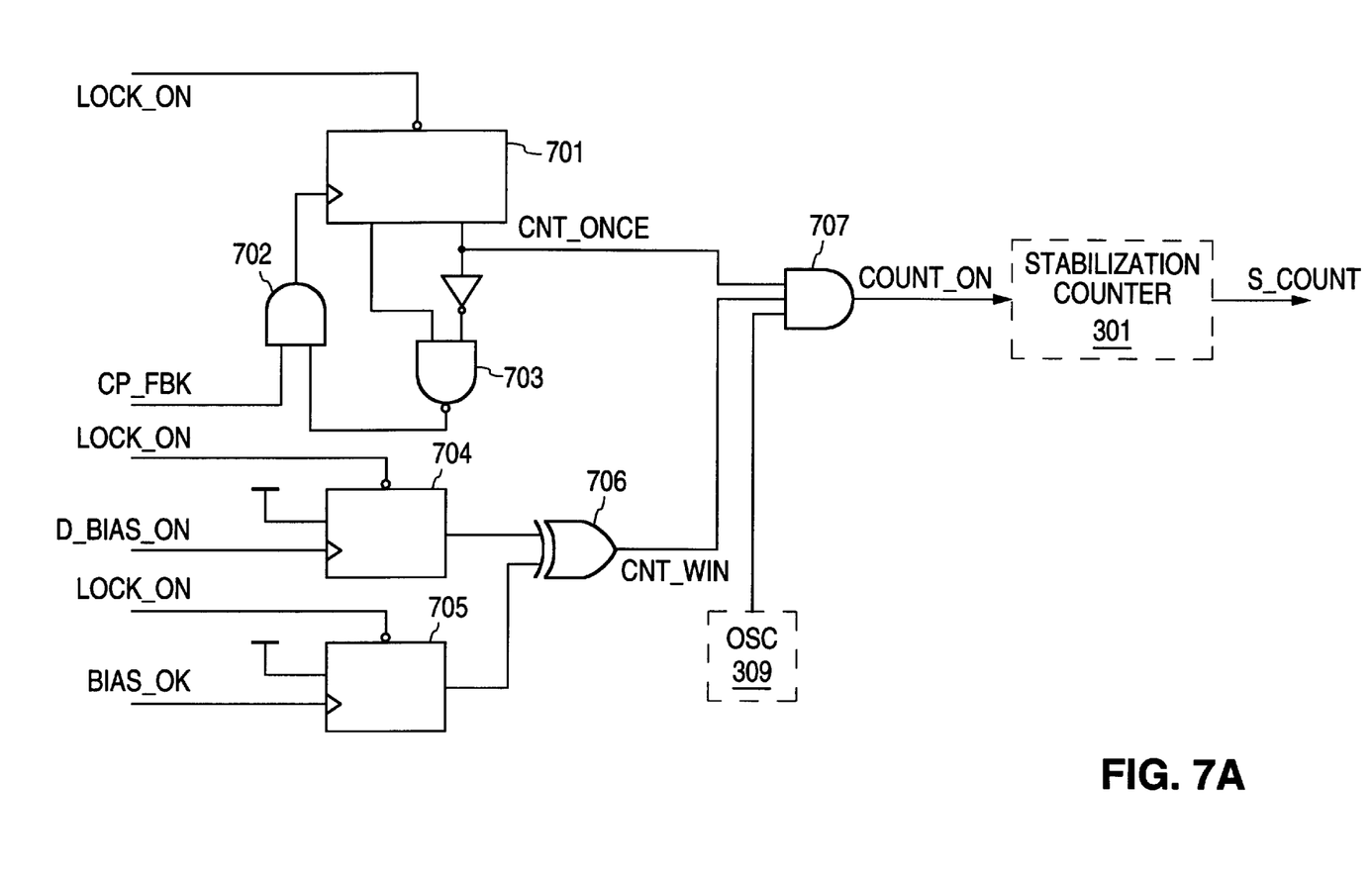
FIG. 7a shows an implementation of a counter logic circuit.

An implementation of counter logic circuit 305 is shown in FIG. 7a. A binary counter 701 is reset to a "00"state by signal LOCK_ON. This forces the output of a NAND gate 703 into a logic HIGH state. The next signal CP_FBK from charge pump 104 received by an AND gate 702 increments counter 701 into a "01"state. As a result, signal CNT_ONCE, which represents the most significant bit of counter 701, provides a logic HIGH output. Signal LOCK_ON also resets D-type flip-flops 704 and 705. Upon receipt of signal D_BIAS_ON, flip-flop 704 produces a logic HIGH output, switching an output signal CNT_WIN from an XOR gate 706 into a logic HIGH state. When signals CNT_ONCE and CNT_WIN are both in logic HIGH states, a three-input AND gate 707 produces a signal COUNT_ON composed of pulses from oscillator 309. Signal COUNT_ON clocks stabilization counter 301. When flip-flop 705 receives signal BIAS_OK, it asserts a logic HIGH output, forcing signal CNT_WIN back into a logic LOW state, and blocking any further signal COUNT_ON from AND gate 707. At the next signal CP_FBK, counter 701 increments into a "10" state, forcing both signal CNT_ONCE and the output of NAND gate 703 into logic LOW states. This effectively prevents any further counting activity by stabilization counter 301 until binary counter 701 is reset.

Figure 7B:
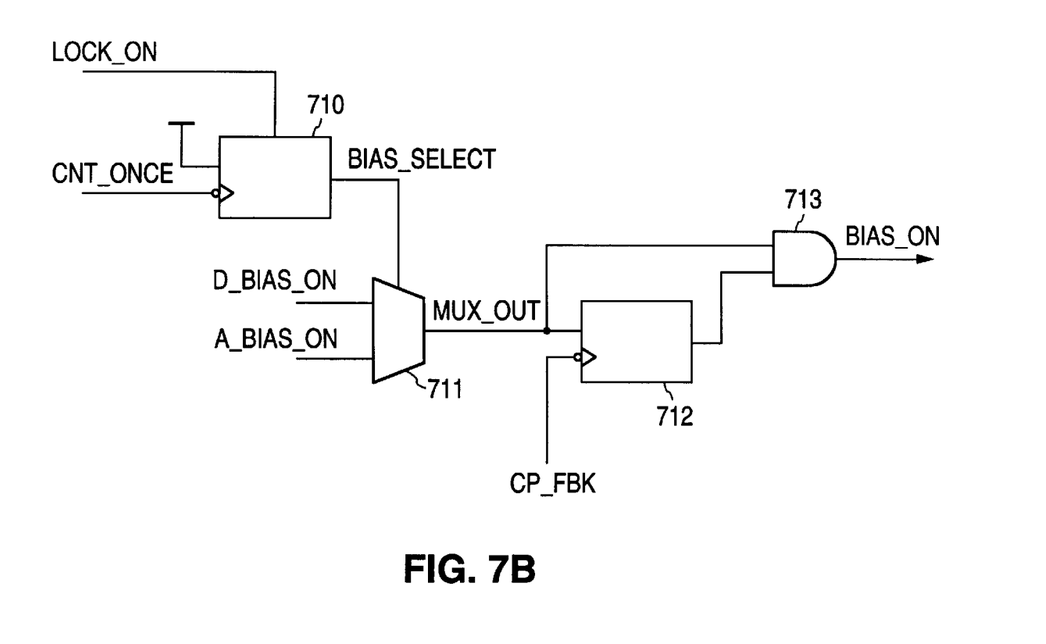
FIG. 7b shows an implementation of an output logic circuit.

An implementation of output logic circuit 306 is shown in FIG. 7b. A D-type flip-flop 710 generates an output signal BIAS_SELECT that selects an output signal MUX_OUT from a multiplexer 711. While signal BIAS_SELECT is in a logic LOW state, multiplexer 711 passes signal D_BIAS_ON as signal MUX_OUT. However, when the falling edge of signal CNT_ONCE triggers flip-flop 710, signal BIAS_SELECT swings HIGH, causing multiplexer 711 to pass signal A_BIAS_ON as signal MUX_OUT. A D-type flip-flop 712 provides a logic HIGH output during charge pump operation, allowing an AND gate 713 to provide signal MUX_OUT as signal BIAS_ON, to turn on the bias current source. However, after the charge pump event, the falling edge of signal CP_FBK triggers flip-flop 712, forcing signal BIAS_ON into a logic LOW state and turning off the bias current source. Using signal CP_FBK to trigger flip-flop 712 ensures that bias current is not shut off until after charge pump operation has been completed. In this manner, one cycle after the PLL becomes locked, bias current on time is reduced to a minimum level. When the PLL goes out of lock, the falling edge of signal LOCK_ON resets flip-flop 710, switching the output of multiplexer 711 back to signal D_BIAS_ON and returning bias current activation timing to the constant interval preset in default register 304.

Figure 5:
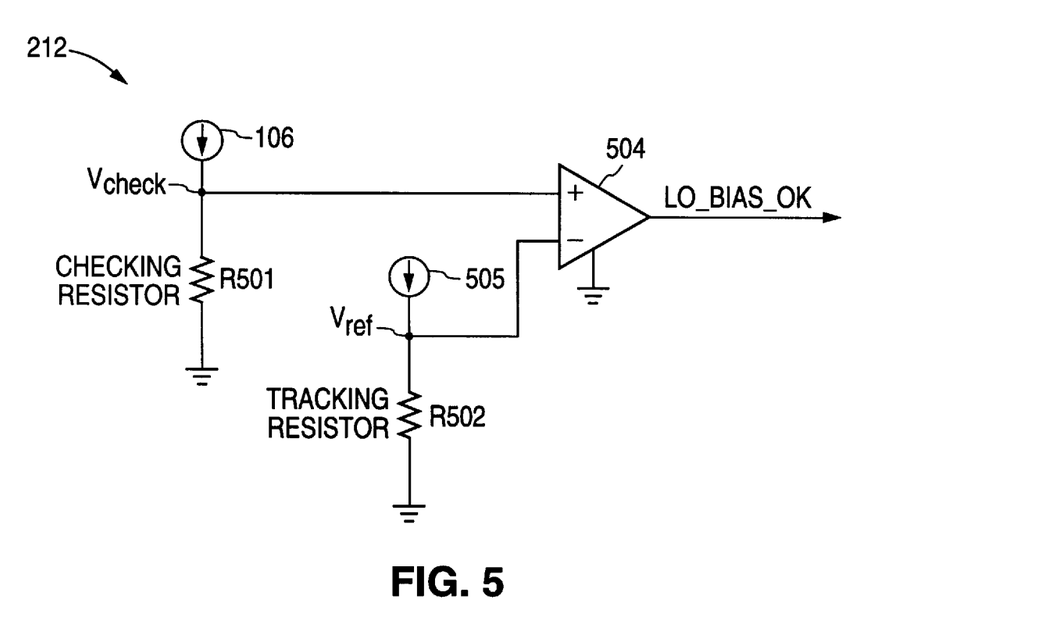
FIG. 5 shows an embodiment of a bias check circuit.
Figure 6:
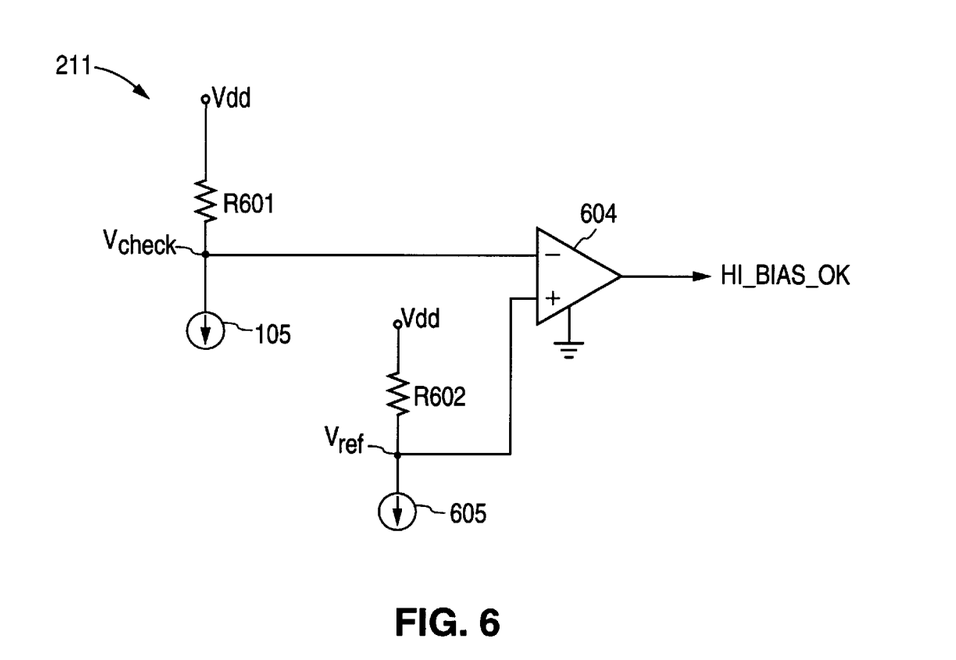
FIG. 6 shows another embodiment of a bias check circuit.

In this scheme for self-adjusting bias current control, proper detection of bias current stabilization is important. An embodiment of bias check circuit 212 is shown in FIG. 5. A checking resistor R501 is placed between current source 106 and ground potential. This produces a checking voltage Vcheck at the non-inverting input of a comparator 504. A reference current source 505 provides a constant current across tracking resistor R502. This provides a positive comparison voltage Vref at the inverting input of comparator 504. By making resistor R502 very large, only a very small current is required from current source 505, minimizing the power consumption of bias check circuit 212. When current source 106 is off, the non-inverting input of comparator 504 is at ground potential, keeping the output of comparator 504 in a logic LOW state. However, current source 505 and resistor R502 are designed such that when current source 106 is providing a constant current, voltage Vcheck at the non-inverting input of comparator 504 is greater than voltage Vref, bringing the output signal LO_BIAS_ON to a logic HIGH state. A similar circuit can provide an embodiment of bias check circuit 211, as shown in FIG. 6. A checking resistor R601 is placed between current source 105 and the circuit power supply voltage Vdd. This produces a checking voltage Vcheck at the inverting input of a comparator 604. A reference current source 605 pulls a constant current across tracking resistor R602. This provides a positive comparison voltage Vref at the non-inverting input of comparator 604. By making resistor R602 very large, current source 605 must sink only a very small current, minimizing the power consumption of bias check circuit 211. When current source 105 is off, the inverting input of comparator 604 is at Vdd, keeping the output of comparator 604 in a logic LOW state. However, current source 605 and resistor R602 are designed such that when current source 105 is providing a constant current, voltage Vcheck at the inverting input of comparator 604 is greater than voltage Vref, bringing the output signal HI_BIAS_ON to a logic HIGH state.

The above detailed description is provided to illustrate the specific embodiments of the present invention, and is not intended to be limiting. Numerous variations and modifications within the present invention will be apparent to one skilled in the art. For example, although separate bias control signals are indicated, as shown by signals HI_ON and LO_ON in FIG. 2, a single signal could be used to turn on both current sources 105 and 106. This single signal could be based on either the longest required interval generated by either self-adjusting control 209 or self-adjusting control 210, or could even be the interval generated by a single self-adjusting control circuit, augmented by a suitable amount of buffering tolerance. In such an implementation, only one self-adjusting control circuit would be required, which would also be the case where the PLL only included one frequency divider. Also, divide-by-N counter 310 could be implemented as a countup counter with appropriate modifications to the control logic, while both counter logic circuit 305 and output logic circuit 306 could be implemented with combinational, rather than sequential, logic. Furthermore, all comparator circuits could include hysteresis for output signal stabilization. Finally, it should be noted that while a conventional comparator circuit is used in the aforementioned implementations for bias check circuits 211 and 212, a current source plus a compensated zener circuit or bandgap reference could also be utilized.

We claim:

1. In an integrated circuit phase-locked loop (PLL) including a divide-by-N counter, a phase comparator, a voltage-controlled oscillator, and a charge pump having a bias current source, a bias control circuit comprising:
   a bias checking circuit for indicating when said bias current source in said charge pump has stabilized; and
   a bias activation circuit to control the operation of said bias current source.

2. The circuit of claim 1 wherein said bias activation circuit includes:
   a default control circuit for activating said bias current for a predefined interval sufficient to ensure proper operation of said charge pump at all operating frequencies; and
   a self-adjusting control circuit for, when said PLL is locked, activating said bias current only as required for proper operation of said charge pump.

3. The circuit of claim 2 wherein said self-adjusting control circuit comprises a self-adjusting logic circuit to turn on said bias current source a calculated lead count of input clock pulses before operation of said charge pump, wherein said lead count is the number of input clock pulses required for said bias current source to stabilize plus a predetermined tolerance count of input clock pulses to accommodate slight operational variations.

4. The circuit of claim 3 wherein said default control circuit comprises a default logic circuit to turn on said bias current source a predefined default count of input clock pulses before operation of said charge pump, whenever said PLL is out of lock or said lead count is unavailable.

5. The circuit of claim 4 wherein said self-adjusting logic circuit comprises:
   a stabilization counter for measuring a stabilization count of input clock pulses required for said bias current source to stabilize after being turned on;
   an adder for combining said stabilization count with said tolerance count to generate said lead count;
   a comparator that asserts an optimized signal for turning on said bias current source when a total count of input clock pulses received by said divide-by-N counter reaches said lead count.

6. The circuit of claim 5 wherein said default logic circuit comprises:
   a default register for storing said default count; and
   a default comparator for asserting a default signal for turning on said bias current source when said total count reaches said default count.

7. The circuit of claim 6 wherein said bias activation circuit further comprises an output logic circuit to provide said optimized signal as a bias activation signal to turn on said bias current source when said PLL is locked, and provide said default signal as said bias activation signal when said PLL is out of lock or said lead count is unavailable.

8. The circuit of claim 7 wherein said output logic circuit comprises:
- a multiplexer to select between said optimized signal and said default signal; and
- a termination logic circuit to turn off said bias current source at the completion of the activity of said charge pump.

9. The circuit of claim 1 wherein said bias checking circuit comprises:
- a comparator;
- a checking resistor coupled to said bias current source;
- a tracking resistor; and
- a reference current source coupled to said tracking resistor, said reference current source generating a reference current that generates a reference voltage drop across said tracking resistor that is substantially equal to a checking voltage that exists across said checking resistor when the steady-state output current of said bias current source is applied across said checking resistor;
- wherein the inverting and non-inverting terminals of said comparator are coupled to either the junction of said reference current source and said tracking resistor, or the junction of said bias current source and said checking resistor, with the inverting terminal of said comparator being coupled to the junction that is at higher potential of the two when said bias current source is off, and the non-inverting terminal of said comparator being coupled to the other junction.

10. The circuit of claim 9 wherein the resistance of said tracking resistor is substantially greater than the resistance of said checking resistor.

11. A method for controlling the activation of a bias current in a PLL having a charge pump and bias circuit in order to reduce power consumption in said PLL comprising the steps of:
(i) when said PLL is locked:
- measuring the time required for said bias current to stabilize after being turned on;
- turning on said bias current just long enough before the operation of said charge pump to allow said bias current to stabilize;

(ii) when said PLL is out of lock:
- turning on said bias current for the minimum time that would be required if the charge pump were operating at maximum frequency.

* * * * *